US012672246B2

(12) United States Patent
Li et al.

(10) Patent No.: US 12,672,246 B2
(45) Date of Patent: Jun. 30, 2026

(54) HINGE MECHANISM AND ELECTRONIC DEVICE

(71) Applicant: Huawei Technologies Co., Ltd., Shenzhen (CN)

(72) Inventors: Xin Li, Dongguan (CN); Kaixu Li, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 65 days.

(21) Appl. No.: 18/923,286

(22) Filed: Oct. 22, 2024

(65) Prior Publication Data

US 2025/0048573 A1 Feb. 6, 2025

Related U.S. Application Data

(63) Continuation of application No. PCT/CN2024/078194, filed on Feb. 22, 2024.

(30) Foreign Application Priority Data

Aug. 1, 2023 (CN) .......................... 202310963260.8

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
None
See application file for complete search history.

(56) References Cited

U.S. PATENT DOCUMENTS 9,071,673 B2 * 6/2015 Choi ...................... G06F 1/1641
11,048,296 B2 * 6/2021 Hsu ........................ G06F 1/1652
2020/0329569 A1 * 10/2020 Kim ...................... G06F 1/1681
2025/0039289 A1 * 1/2025 Kim ................... H04M 1/0268

FOREIGN PATENT DOCUMENTS

CN 1697770 A 11/2005
CN 201178387 Y 1/2009
CN 101534073 A 9/2009
CN 201914512 U 8/2011
(Continued)

*Primary Examiner* — Allen L Parker
*Assistant Examiner* — Christopher L Augustin
(74) *Attorney, Agent, or Firm* — Slater Matsil, LLP

(57) ABSTRACT

A hinge mechanism includes a first base, a second base, a first housing mounting bracket, a second housing mounting bracket, a third housing mounting bracket, a first rotating mechanism, a second rotating mechanism, and a linkage gear member. The second housing mounting bracket is rotatably connected between the first base and the second base. The first housing mounting bracket is rotatably connected to a side that is of the first base and that is away from the second housing mounting bracket. The third housing mounting bracket is rotatably connected to a side that is of the second base and that is away from the second housing mounting bracket. The first rotating mechanism is disposed on the first base. The second rotating mechanism is disposed on the second base. The linkage gear member is separately engaged with a second gear connecting rod and a third gear connecting rod for transmission.

20 Claims, 9 Drawing Sheets

(56)                    References Cited

FOREIGN PATENT DOCUMENTS

| | | | | | |
|---|---|---|---|---|---|
| CN | 106364969 | A | 2/2017 | | |
| CN | 107993554 | A | 5/2018 | | |
| CN | 108053745 | A | 5/2018 | | |
| CN | 108053746 | A | 5/2018 | | |
| CN | 108091240 | A | 5/2018 | | |
| CN | 108091241 | A | 5/2018 | | |
| CN | 207993334 | U | 10/2018 | | |
| CN | 207993335 | U | 10/2018 | | |
| CN | 111833728 | A | 10/2020 | | |
| CN | 111915986 | A | 11/2020 | | |
| CN | 115412624 | A | * 11/2022 | .......... | H04M 1/0222 |

* cited by examiner

HINGE MECHANISM AND ELECTRONIC DEVICE

CROSS-REFERENCE TO RELATED APPLICATIONS

This application is a continuation of International Application No. PCT/CN2024/078194, filed on Feb. 22, 2024, which claims priority to Chinese Patent Application No. 202310963260.8, filed on Aug. 1, 2023. The disclosures of the aforementioned applications are hereby incorporated by reference in their entireties.

TECHNICAL FIELD

This application relates to the field of electronic device technologies, and in particular, to a hinge mechanism and an electronic device.

BACKGROUND

As flexible display technologies gradually become mature, display manners of electronic devices change greatly. A mobile phone with a foldable flexible display, a tablet computer with a foldable flexible display, a wearable electronic device with a foldable flexible display, and the like are an important evolution direction of intelligent electronic devices in the future.

To meet user requirements for a large display picture and portability of a foldable electronic device, a triple-foldable device is gradually used in people's daily life. The triple-foldable device includes a flexible display, a first hinge mechanism, and a second hinge mechanism. The flexible display includes a first display part, a second display part, and a third display part. The second display part is located between the first display part and the third display part. The first display part may be unfolded or folded relative to the second display part by using the first hinge mechanism, and the third display part may be unfolded or folded relative to the second display part by using the second hinge mechanism. In addition, when the triple-foldable device is in a folded state, the first display part and the third display part are sequentially stacked on a same side of the second display part. However, during folding, a user may fold the first display part and the third display part in an incorrect order. Consequently, the flexible display is damaged.

SUMMARY

This application provides a hinge mechanism and an electronic device, to implement linkage folding of the electronic device.

According to a first aspect, this application provides a hinge mechanism. The hinge mechanism may specifically include a first base, a second base, a first housing mounting bracket, a second housing mounting bracket, a third housing mounting bracket, a first rotating mechanism, a second rotating mechanism, and a linkage gear member. Specifically, the first base and the second base are disposed in parallel. The second housing mounting bracket is rotatably connected between the first base and the second base. The first housing mounting bracket is rotatably connected to a side that is of the first base and that is away from the second housing mounting bracket. The third housing mounting bracket is rotatably connected to a side that is of the second base and that is away from the second housing mounting bracket. The first rotating mechanism may specifically include a first rotating gear, a second rotating gear, a first gear connecting rod, and a second gear connecting rod. The first rotating gear is engaged with the second rotating gear. The first rotating gear and the second rotating gear are separately rotatably connected to the first base. The second rotating gear is located on a side that is of the first rotating gear and that is away from the first housing mounting bracket. One end of the first gear connecting rod is engaged with the first rotating gear, and the other end is slidably connected to the first housing mounting bracket. One end of the second gear connecting rod is engaged with the second rotating gear, and the other end is slidably connected to the second housing mounting bracket. The second rotating mechanism includes a third rotating gear, a fourth rotating gear, a third gear connecting rod, and a fourth gear connecting rod. The third rotating gear is engaged with the fourth rotating gear. The third rotating gear and the fourth rotating gear are separately rotatably connected to the second base. The fourth rotating gear is located on a side that is of the third rotating gear and that is away from the second housing mounting bracket. One end of the third gear connecting rod is engaged with the third rotating gear, and the other end is slidably connected to the second housing mounting bracket. One end of the fourth gear connecting rod is engaged with the fourth rotating gear, and the other end is slidably connected to the third housing mounting bracket. A sliding track of the second gear connecting rod relative to the second housing mounting bracket is parallel to and does not coincide with a sliding track of the third gear connecting rod relative to the second housing mounting bracket. The linkage gear member is disposed on the second housing mounting bracket. The linkage gear member is located between the second gear connecting rod and the third gear connecting rod. The second gear connecting rod and the third gear connecting rod are separately engaged with the linkage gear member for transmission.

The hinge mechanism in this application is used in a foldable electronic device. When the electronic device is folded, an external force may be applied to the first housing mounting bracket or the third housing mounting bracket. When an external force is applied to the first housing mounting bracket, the first housing mounting bracket rotates in a direction close to the second housing mounting bracket, so that the first gear connecting rod slides relative to the first housing mounting bracket, and the first rotating gear, the second rotating gear, and the second gear connecting rod rotate synchronously with the first gear connecting rod. In the synchronous rotation process, the second gear connecting rod may slide relative to the second housing mounting bracket in a direction away from the second base, and the linkage gear member drives the third gear connecting rod to slide in a direction away from the first base, so as to drive the third rotating gear, the fourth rotating gear, and the fourth gear connecting rod to rotate synchronously with the third gear connecting rod, so that the third gear connecting rod slides relative to the third housing mounting bracket, and therefore the third housing mounting bracket rotates in a direction close to the second housing mounting bracket. When an external force is applied to the third housing mounting bracket, the third housing mounting bracket rotates in a direction close to the second housing mounting bracket, so that the fourth gear connecting rod slides relative to the third housing mounting bracket, and the fourth rotating gear, the third rotating gear, and the third gear connecting rod rotate synchronously. In the synchronous rotation process, the third gear connecting rod may slide relative to the second housing mounting bracket in a direction away from the first base, and the linkage gear member drives the second gear connecting rod to slide in a direction away from the second base, so as to drive the second rotating gear, the first rotating gear, and the first gear connecting rod to rotate synchronously with the second gear connecting rod, so that the first gear connecting rod slides relative to the first housing mounting bracket, and therefore the first housing mounting bracket rotates in a direction close to the second housing mounting bracket. Therefore, regardless of whether the first housing mounting bracket or the third housing mounting bracket is first folded, the linkage gear member can implement linkage of rotation of the first housing mounting bracket and the third housing mounting bracket relative to the second housing mounting bracket, to implement linkage folding of the electronic device.

In some technical solutions, the linkage gear member may implement a linkage function. Specifically, the linkage gear member may include at least one first linkage gear. The first linkage gear has a first tooth. The first linkage gear enables the second gear connecting rod and the third gear connecting rod to have equal sliding distances on the second housing mounting bracket.

In some other technical solutions, the linkage gear member may implement both a linkage function and a differential function. Specifically, the linkage gear member may include at least one second linkage gear. A second tooth is disposed on a side that is of the second linkage gear and that faces the second gear connecting rod, and a third tooth is disposed on a side that is of the second linkage gear and that faces the third gear connecting rod. When the second gear connecting rod and the third gear connecting rod slide on the second housing mounting bracket, because the second tooth is different from the third tooth, a sliding distance of the second gear connecting rod on the second housing mounting bracket is different from a sliding distance of the third gear connecting rod on the second housing mounting bracket, so that a rotation speed of the first housing mounting bracket around the first base is different from a rotation speed of the third housing mounting bracket around the second base, to implement differential rotation of the first housing mounting bracket and the third housing mounting bracket.

The second tooth may be different from the third tooth specifically in at least one of a quantity of second teeth and third teeth, a modulus, a tooth pitch, and a reference diameter.

When the linkage gear member enables the second gear connecting rod and the third gear connecting rod to have equal sliding distances on the second housing mounting bracket, the hinge mechanism may further include a first differential mechanism and a second differential mechanism. Specifically, the first differential mechanism includes a first hinge, a first rotating member, and a second rotating member. The first hinge is disposed on the first base. The first rotating member is rotatably connected between the first housing mounting bracket and the first hinge. The second rotating member is rotatably connected between the second housing mounting bracket and the first hinge. The second differential mechanism includes a second hinge, a third rotating member, and a fourth rotating member. The second hinge is disposed on the second base. The third rotating member is rotatably connected between the second housing mounting bracket and the second hinge. The fourth rotating member is rotatably connected between the third housing mounting bracket and the second hinge. A rotation radius of the first differential mechanism is set to be different from a rotation radius of the second differential mechanism, to implement differential rotation of the first housing mounting bracket and the third housing mounting bracket.

When the first differential mechanism is specifically disposed, in some technical solutions, the first rotating member may be a first connecting rod, and the second rotating member may be a second connecting rod. Alternatively, in some other technical solutions, the first rotating member may be a first arc arm, and a first arc-shaped guiding groove is provided on a side that is of the first hinge and that is close to the first arc arm. The first arc arm may be accommodated in the first arc-shaped guiding groove, and the first arc arm slides in the first arc-shaped guiding groove, to implement a rotational connection between the first rotating member and the first hinge. Correspondingly, the second rotating member may be a second arc arm, and a second arc-shaped guiding groove is provided on a side that is of the first hinge and that is close to the second arc arm. The second arc arm may be accommodated in the second arc-shaped guiding groove, and the second arc arm slides in the second arc-shaped guiding groove, to implement a rotational connection between the second rotating member and the first hinge.

Similarly, when the second differential mechanism is specifically disposed, in some technical solutions, the third rotating member may be a third connecting rod, and the fourth rotating member may be a fourth connecting rod. Alternatively, in some other technical solutions, the third rotating member may be a third arc arm, and a third arc-shaped guiding groove is provided on a side that is of the second hinge and that is close to the third arc arm. The third arc arm may be accommodated in the third arc-shaped guiding groove, and the third arc arm slides in the third arc-shaped guiding groove, to implement a rotational connection between the third rotating member and the second hinge. The fourth rotating member may be a fourth arc arm, and a fourth arc-shaped guiding groove is provided on a side that is of the second hinge and that is close to the fourth arc arm. The fourth arc arm may be accommodated in the fourth arc-shaped guiding groove, and the fourth arc arm slides in the fourth arc-shaped guiding groove, to implement a rotational connection between the fourth rotating member and the second hinge.

The second housing mounting bracket has a middle plane. To set the rotation radius of the first differential mechanism to be different from the rotation radius of the second differential mechanism, specifically, when the hinge mechanism is in an unfolded state, there is a first distance between a rotation axis center of the first rotating member and the middle plane in a thickness direction of the second housing mounting bracket, there is a second distance between a rotation axis center of the second rotating member and the middle plane, there is a third distance between a rotation axis center of the third rotating member and the middle plane, and there is a fourth distance between a rotation axis center of the fourth rotating member and the middle plane, where the first distance is equal to the second distance, the third distance is equal to the fourth distance, and the first distance is not equal to the third distance. In addition, a rotation radius of the first hinge rotating around the second housing mounting bracket is also set to be different from a rotation radius of the second hinge rotating around the second housing mounting bracket.

When the first rotating mechanism is specifically disposed, the first gear connecting rod may include a first gear segment and a first slider that are fastened to each other. The first gear segment is engaged with the first rotating gear, a side that is of the first housing mounting bracket and that faces the first gear connecting rod has a first sliding groove, and the first slider is accommodated in the first sliding groove and slides in the first sliding groove to implement a sliding connection between the first gear connecting rod and the first housing mounting bracket. Correspondingly, the second gear connecting rod may include a second gear segment and a second slider that are fastened to each other. The second gear segment is engaged with the second rotating gear. A side that is of the second housing mounting bracket and that faces the second gear connecting rod has a second sliding groove. The second slider is accommodated in the second sliding groove and slides in the second sliding groove to implement a sliding connection between the second gear connecting rod and the second housing mounting bracket. Similarly, when the second rotating mechanism is specifically disposed, the third gear connecting rod may include a third gear segment and a third slider that are fastened to each other. The third gear segment is engaged with the third rotating gear. A side that is of the second housing mounting bracket and that faces the third gear connecting rod has a third sliding groove. The third slider is accommodated in the third sliding groove and slides in the third sliding groove to implement a sliding connection between the third gear connecting rod and the second housing mounting bracket. Correspondingly, the fourth gear connecting rod may include a fourth gear segment and a fourth slider that are fastened to each other. The fourth gear segment is engaged with the fourth rotating gear. A side that is of the third housing mounting bracket and that faces the fourth gear connecting rod has a fourth sliding groove. The fourth slider is accommodated in the fourth sliding groove and slides in the fourth sliding groove to implement a sliding connection between the fourth gear connecting rod and the third housing mounting bracket.

A first rack may be disposed on a side that is of the second gear connecting rod and that faces the linkage gear member, and the first rack is engaged with the linkage gear member. Similarly, a second rack is disposed on a side that is of the third gear connecting rod and that faces the linkage gear member, and the second rack is engaged with the linkage gear member. This can implement a transmission connection between the linkage gear member, and the second gear connecting rod and the third gear connecting rod.

According to a second aspect, this application provides an electronic device. The electronic device includes a flexible display, a first housing, a second housing, a third housing, and the hinge mechanism according to the first aspect. The first housing is fastened to the first housing mounting bracket, the second housing is fastened to the second housing mounting bracket, and the third housing is fastened to the third housing mounting bracket. The flexible display continuously covers the first housing, the second housing, the third housing, and the hinge mechanism, and is separately fastened to the first housing, the second housing, and the third housing. When the electronic device is folded, regardless of whether the first housing or the third housing is first folded, the hinge mechanism can implement linkage of rotation of the first housing and the third housing relative to the second housing, to implement linkage folding of the electronic device.

The electronic device may be an inward foldable electronic device. A rotation axis center of the first rotating mechanism rotating around the first base is located on a side that is of the first base and that faces the flexible display, and a rotation axis center of the second rotating mechanism rotating around the second base is located on a side that is of the second base and that faces the flexible display. Alternatively, the electronic device may be an outward foldable electronic device. A rotation axis center of the first rotating mechanism rotating around the first base is located on a side that is of the first base and that is away from the flexible display, and a rotation axis center of the second rotating mechanism rotating around the second base is located on a side that is of the second base and that is away from the flexible display. Alternatively, the electronic device may be a Z-foldable device. A rotation axis center of the first rotating mechanism rotating around the first base is located on a side that is of the first base and that faces the flexible display, and a rotation axis center of the second rotating mechanism rotating around the second base is located on a side that is of the second base and that is away from the flexible display.

REFERENCE NUMERALS

10: electronic device;
11: hinge mechanism;
12: flexible display;
13: first housing;
14: second housing;
15: third housing;
111: first base;

112: second base;
113: first housing mounting bracket;
114: second housing mounting bracket;
115: third housing mounting bracket;
116: first rotating mechanism;
117: second rotating mechanism;
118: linkage gear member;
119: first differential mechanism;
110: second differential mechanism;
1131: first sliding groove;
1141: second sliding groove;
1142: third sliding groove;
1151: fourth sliding groove;
1161: first gear connecting rod;
1162: first rotating gear;
1163: second rotating gear;
1164: second gear connecting rod;
1171: third gear connecting rod;
1172: third rotating gear;
1173: fourth rotating gear;
1174: fourth gear connecting rod;
1181: first linkage gear;
1182: second linkage gear;
1191: first hinge;
1192: first rotating member;
1193: second rotating member;
1101: second hinge;
1102: third rotating member;
1103: fourth rotating member;
11611: first slider;
11612: first gear segment;
11641: second gear segment;
11642: second slider;
11643: first rack;
11711: third slider;
11712: third gear segment;
11741: fourth gear segment;
11742: fourth slider;
11713: second rack;
11821: second teeth;
11822: third teeth.

DETAILED DESCRIPTION OF ILLUSTRATIVE EMBODIMENTS

To make the objectives, technical solutions, and advantages of this application clearer, the following further describes this application in detail with reference to the accompanying drawings.

Figure 1:
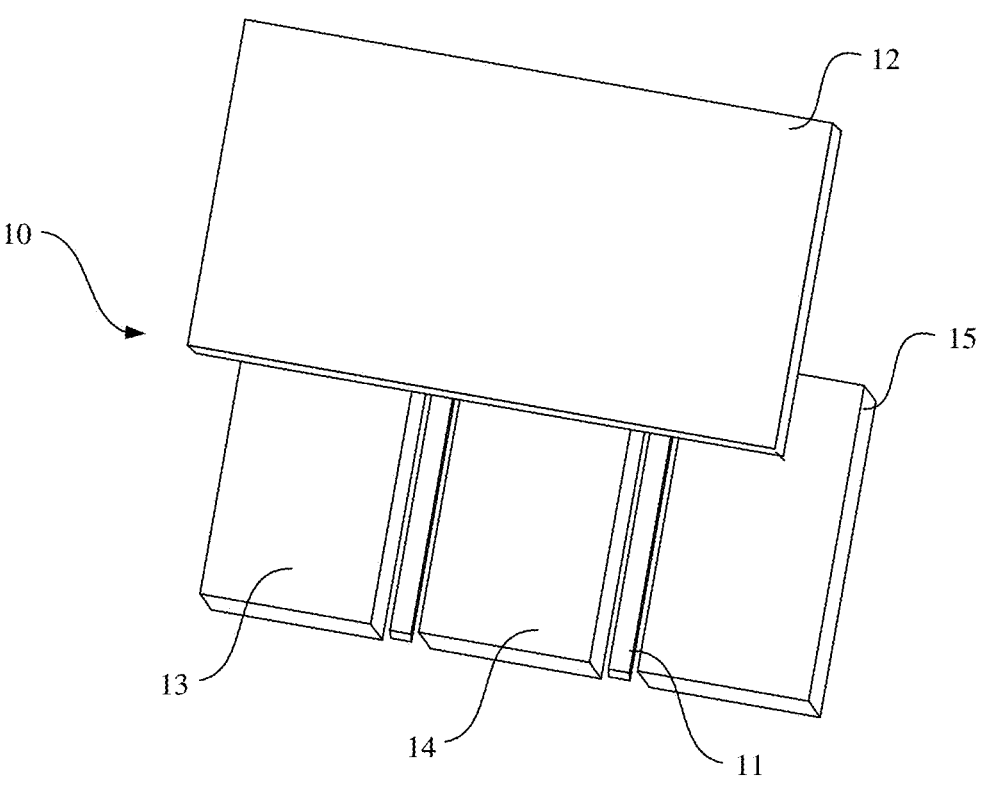
FIG. 1 is a diagram of an electronic device according to an embodiment of this application.
Figure 2:
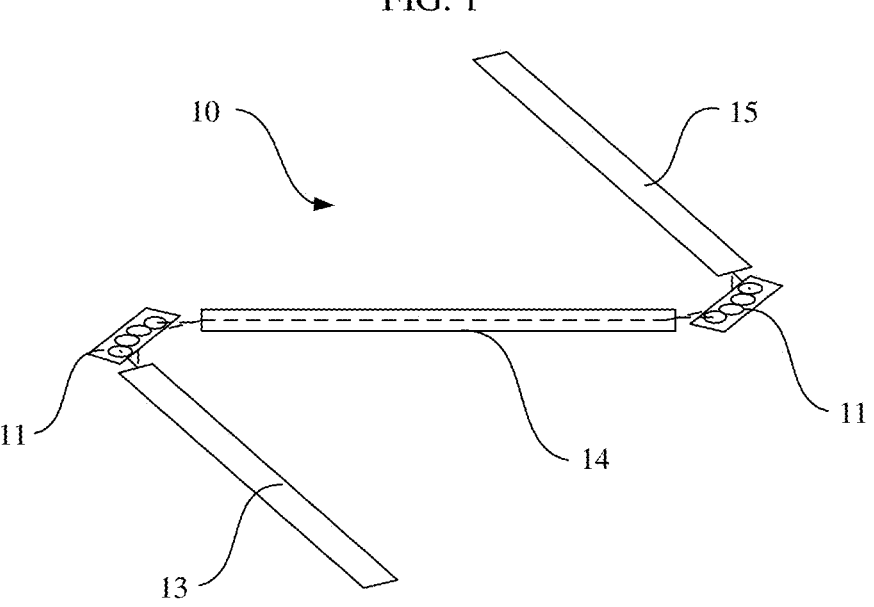
FIG. 2 is a diagram of folding of an electronic device according to an embodiment of this application.
Figure 3:
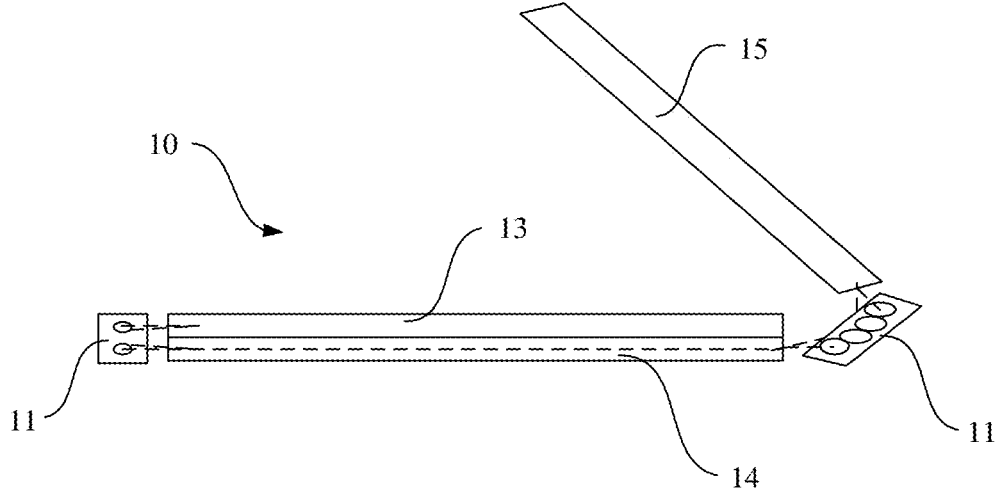
FIG. 3 is another diagram of folding of an electronic device according to an embodiment of this application.

For ease of understanding of a hinge mechanism provided in embodiments of this application, the following describes an application scenario of the hinge mechanism. The hinge mechanism may be used in, but is not limited to, a mobile phone, an intelligent wearable device, a tablet computer, a notebook computer, and another foldable electronic device. When the hinge mechanism provided in embodiments of this application is used in an electronic device, refer to FIG. 1. FIG. 1 is a diagram of a structure of an electronic device according to an embodiment of this application. The electronic device 10 provided in this application is a triple-foldable electronic device, and may specifically include a hinge mechanism 11, a flexible display 12, a first housing 13, a second housing 14, and a third housing 15. The second housing 14 is located between the first housing 13 and the third housing 15, and the first housing 13, the second housing 14, and the third housing 15 are separately connected to the hinge mechanism 11. The flexible display 12 continuously covers the first housing 13, the second housing 14, the third housing 15, and the hinge mechanism 11, and the first housing 13, the second housing 14, and the third housing 15 are separately fastened to the flexible display 12. In the electronic device 10, the first housing 13 and the third housing 15 may rotate around the second housing 14 under an action of the hinge mechanism 11, so that the electronic device 10 can be folded and unfolded. FIG. 2 is a diagram of folding of the electronic device according to an embodiment of this application. As shown in FIG. 2, when the electronic device 10 is in a folded state, the first housing 13 and the third housing 15 may be respectively folded on two sides of the second housing 14, that is, the electronic device 10 is Z-foldable. FIG. 3 is another diagram of folding of the electronic device according to an embodiment of this application. As shown in FIG. 3, the first housing 13 and the third housing 15 may alternatively be stacked on a same side of the second housing 14. In this case, the electronic device 10 may be an outward foldable electronic device. In other words, when the electronic device 10 is in the folded state, the flexible display 12 may be used as both a display surface of the electronic device 10 and an appearance surface of the electronic device 10. It may be understood that a process in which the electronic device 10 changes from an unfolded state to the folded state or from the folded state to the unfolded state is a process in which the first housing 13 and the third housing 15 rotate around the hinge mechanism 11. In this process, the flexible display 12 is bent or flattened with the first housing 13 and the third housing 15. Certainly, the electronic device 10 may alternatively be an inward foldable electronic device. In other words, the flexible display 12 is used as only a display surface of the electronic device 10, and when the electronic device 10 is in the folded state, the first housing 13, the second housing 14, and the hinge mechanism 11 can form a first accommodation space that is in a shape similar to a water drop and that can meet a bending requirement of the flexible display 12, and the second housing 14, the third housing 15, and the hinge mechanism 11 can form a second accommodation space that is in a shape similar to a water drop and that can meet the bending requirement of the flexible display 12, to avoid pulling or extrusion on the flexible display 12, so that a risk of damage to the flexible display 12 can be reduced.

In some current foldable electronic devices, a first housing and a third housing separately rotate around a second housing by using a hinge mechanism. However, in a foldable electronic device having a folding order, a user may fold a first housing and a third housing in an incorrect order, causing damage to a flexible display and compromising reliability of the electronic device. This affects user experience. Therefore, this application provides a hinge mechanism and an electronic device, to implement linkage folding of the electronic device.

It should be noted that the terms used in the following embodiments are merely for the purpose of describing specific embodiments, but are not intended to limit this application. The terms "one", "a", "the", "the foregoing", "this", and "the one" of singular forms used in this specification and the appended claims of this application are also intended to include expressions such as "one or more", unless otherwise specified in the context clearly.

Reference to "an embodiment", "some embodiments", or the like described in this specification indicates that one or more embodiments of this application include a specific feature, structure, or characteristic described with reference to the embodiments. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "comprise", "have", and their variants all mean "include but are not limited to", unless otherwise specifically emphasized in another manner.

Figure 4:
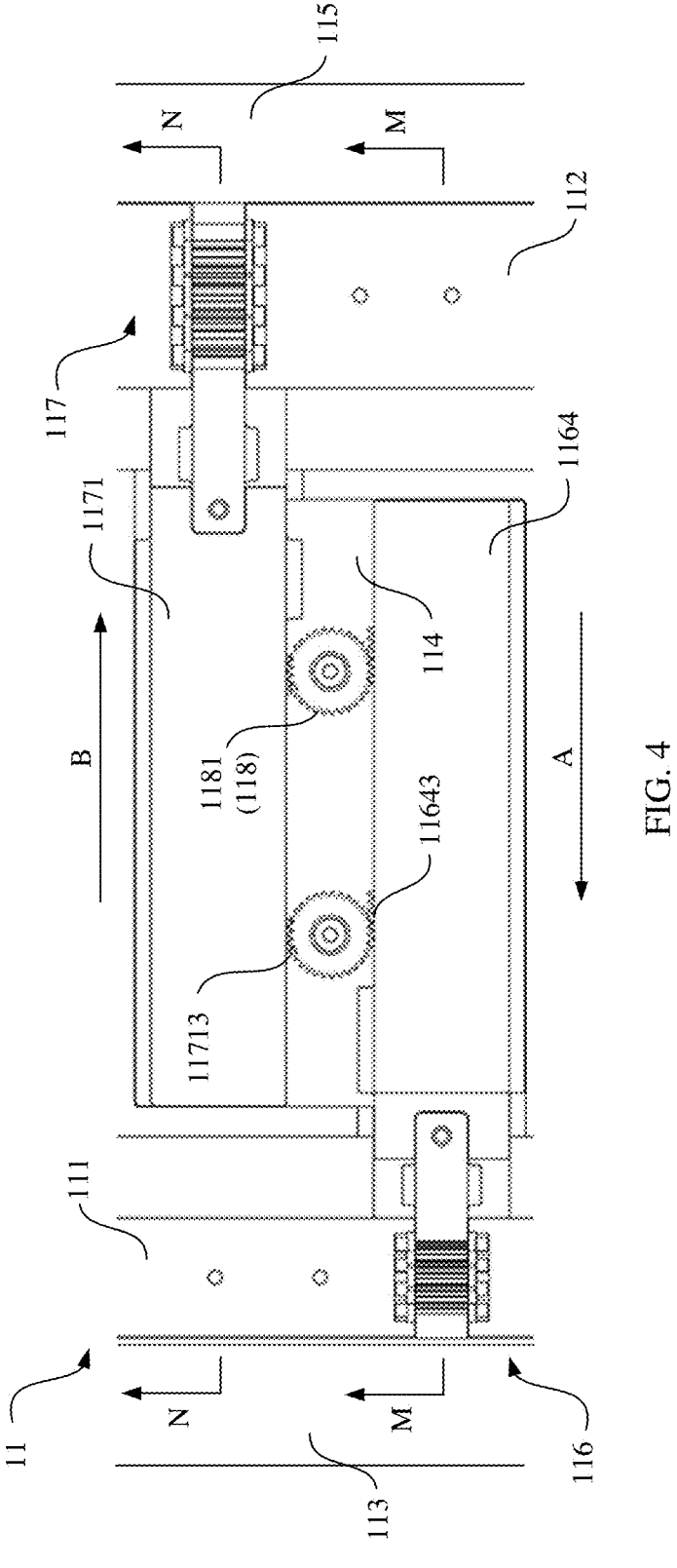
FIG. 4 is a diagram of a hinge mechanism according to an embodiment of this application.

FIG. 4 is a diagram of a hinge mechanism according to an embodiment of this application. As shown in FIG. 4, the hinge mechanism 11 includes a first base 111, a second base 112, a first housing mounting bracket 113, a second housing mounting bracket 114, a third housing mounting bracket 115, a first rotating mechanism 116, and a second rotating mechanism 117. The first base 111 and the second base 112 are disposed in parallel. The first housing mounting bracket 113 and the second housing mounting bracket 114 are oppositely disposed on two sides of the first base 111 and are separately rotatably connected to the first base 111. The second housing mounting bracket 114 and the third housing mounting bracket 115 are oppositely disposed on two sides of the second base 112 and are separately rotatably connected to the second base 112. The second housing mounting bracket 114 is located between the first base 111 and the second base 112. When the hinge mechanism 11 is used in the electronic device 10, the first housing 13 is fastened to the first housing mounting bracket 113, the second housing 14 is fastened to the second housing mounting bracket 114, and the third housing 15 is fastened to the third housing mounting bracket 115. In some embodiments, the electronic device 10 may be an inward foldable electronic device. A rotation axis center of the first rotating mechanism 116 rotating around the first base 111 may be located on a side that is of the first base 111 and that faces the flexible display 12, and a rotation axis center of the second rotating mechanism 117 rotating around the second base 112 may be located on a side that is of the second base 112 and that faces the flexible display 12. In some other embodiments, the electronic device 10 may alternatively be an outward foldable electronic device. A rotation axis center of the first rotating mechanism 116 rotating around the first base 111 may be located on a side that is of the first base 111 and that is away from the flexible display 12, and a rotation axis center of the second rotating mechanism 117 rotating around the second base 112 may be located on a side that is of the second base 112 and that is away from the flexible display 12. In some other embodiments, the electronic device 10 may alternatively be a Z-foldable device. A rotation axis center of the first rotating mechanism 116 rotating around the first base 111 is located on a side that is of the first base 111 and that faces the flexible display 12, and a rotation axis center of the second rotating mechanism 117 rotating around the second base 112 is located on a side that is of the second base 112 and that is away from the flexible display 12.

Figure 5:
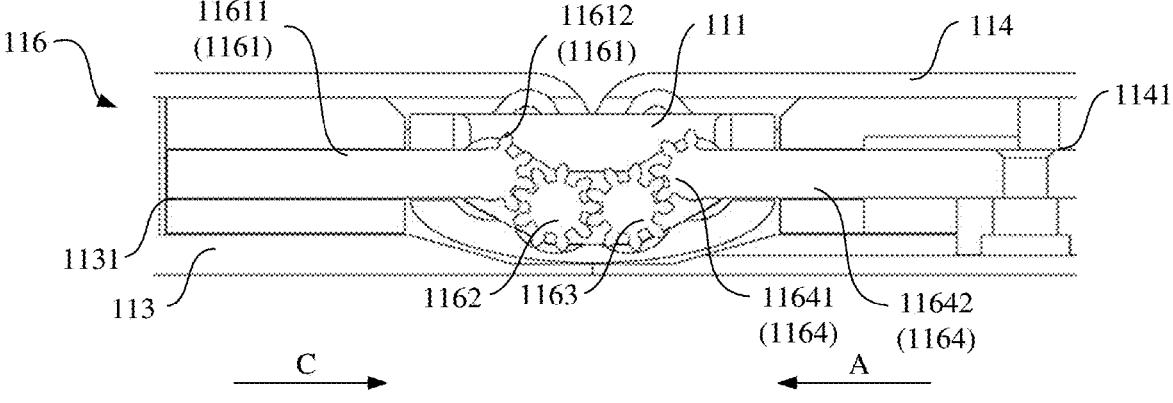
FIG. 5 is a diagram of a first rotating mechanism according to an embodiment of this application.

FIG. 5 is a diagram of the first rotating mechanism according to an embodiment of this application. As shown in FIG. 5, the first rotating mechanism 116 may include a first gear connecting rod 1161, a first rotating gear 1162, a second rotating gear 1163, and a second gear connecting rod 1164. The first rotating gear 1162 is engaged with the second rotating gear 1163, and the first rotating gear 1162 and the second rotating gear 1163 are separately rotatably connected to the first base 111. The first rotating gear 1162 is disposed close to the first housing mounting bracket 113, and the second rotating gear 1163 is disposed close to the second housing mounting bracket 114. The first gear connecting rod 1161 is located between the first housing mounting bracket 113 and the first base 111. One end of the first gear connecting rod 1161 is slidably connected to the first housing mounting bracket 113, and the other end is engaged with the first rotating gear 1162. The second gear connecting rod 1164 is located between the second housing mounting bracket 114 and the first base 111. One end of the second gear connecting rod 1164 is slidably connected to the second housing mounting bracket 114, and the other end is engaged with the second rotating gear 1163.

Figure 6:
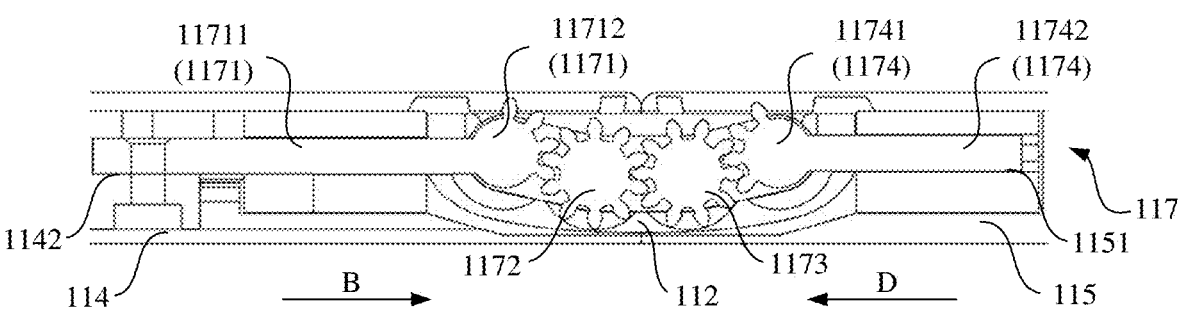
FIG. 6 is a diagram of a second rotating mechanism according to an embodiment of this application.

FIG. 6 is a diagram of the second rotating mechanism according to an embodiment of this application. As shown in FIG. 6, the second rotating mechanism 117 may include a third gear connecting rod 1171, a third rotating gear 1172, a fourth rotating gear 1173, and a fourth gear connecting rod 1174. The third rotating gear 1172 is engaged with the fourth rotating gear 1173, and the third rotating gear 1172 and the fourth rotating gear 1173 are separately rotatably connected to the second base 112. The third rotating gear 1172 is disposed close to the second housing mounting bracket 114, and the fourth rotating gear 1173 is disposed close to the third housing mounting bracket 115. The third gear connecting rod 1171 is located between the second housing mounting bracket 114 and the second base 112. One end of the third gear connecting rod 1171 is slidably connected to second housing mounting bracket 114, and the other end is engaged with the third rotating gear 1172. The fourth gear connecting rod 1174 is located between the third housing mounting bracket 115 and the second base 112. One end of the fourth gear connecting rod 1174 is slidably connected to the third housing mounting bracket 115, and the other end is engaged with the fourth rotating gear 1173.

Still refer to FIG. 4. A sliding track of the second gear connecting rod 1164 relative to the second housing mounting bracket 114 is parallel to and does not coincide with a sliding track of the third gear connecting rod 1171 relative to the second housing mounting bracket 114. The hinge mechanism 11 may further include a linkage gear member 118 disposed on the second housing mounting bracket 114. The linkage gear member 118 is located between the second gear connecting rod 1164 and the third gear connecting rod 1171, and the linkage gear member 118 is separately engaged with the second gear connecting rod 1164 and the third gear connecting rod 1171 for transmission.

Figure 7:
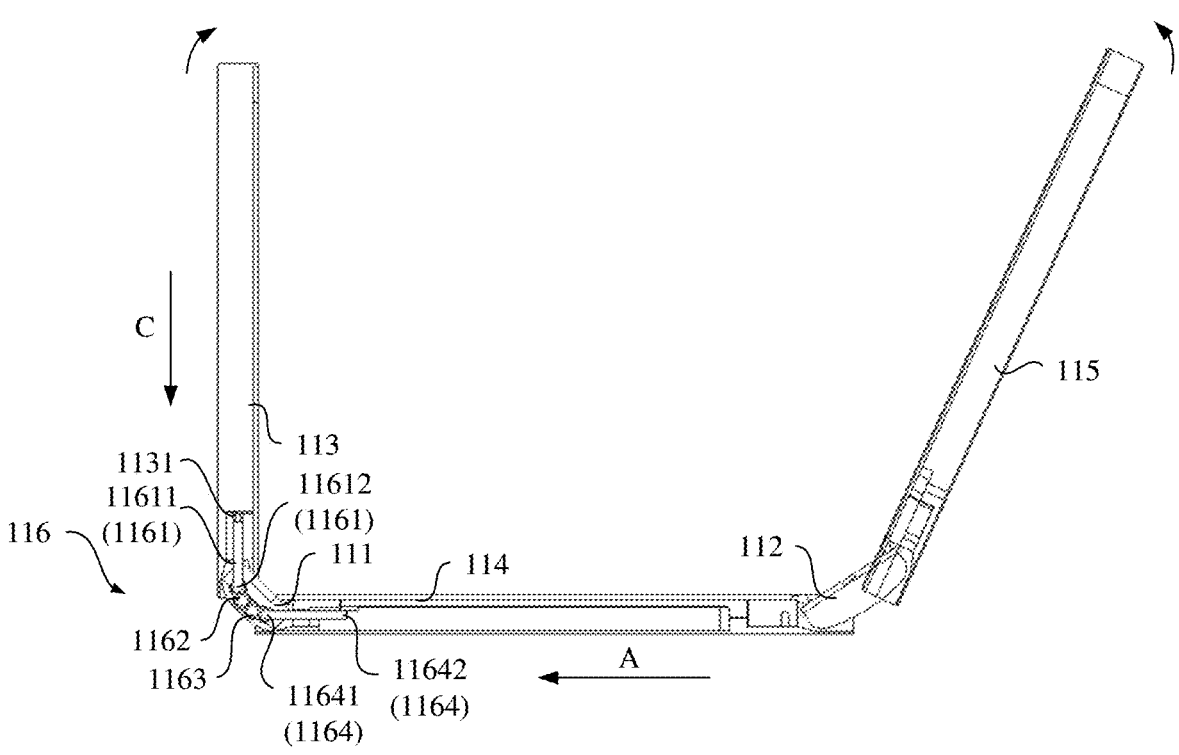
FIG. 7 is a sectional view of the hinge mechanism in FIG. 4 in an M-M direction.
Figure 8:
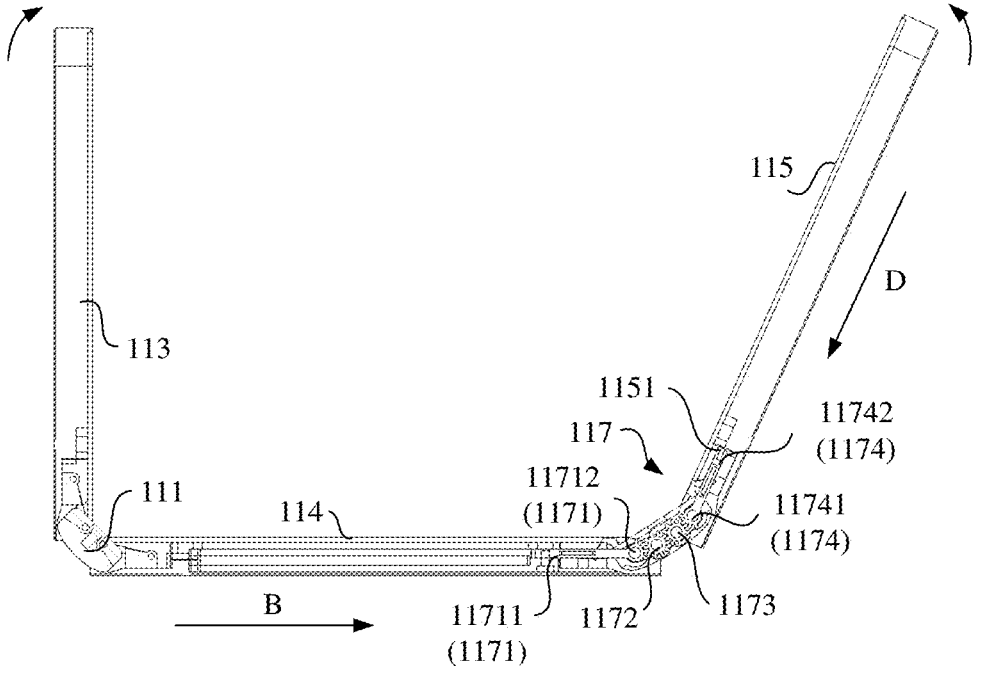
FIG. 8 is a sectional view of the hinge mechanism in FIG. 4 in an N-N direction.

When folding the electronic device 10, the user may apply an external force to either of the first housing mounting bracket 113 and the second housing mounting bracket 114. FIG. 7 is a sectional view of the hinge mechanism in FIG. 4 in an M-M direction. As shown in FIG. 4 and FIG. 7, when the user first folds the first housing mounting bracket 113, the first housing mounting bracket 113 rotates in a direction close to the second housing mounting bracket 114. In this case, the first gear connecting rod 1161 slides relative to the first housing mounting bracket 113 toward the second housing mounting bracket 114 (that is, a direction shown by an arrow C in FIG. 7), to drive the first rotating gear 1162, the second rotating gear 1163, and the second gear connecting rod 1164 to rotate synchronously, so that the second gear connecting rod 1164 slides relative to the second housing mounting bracket 114 in a direction (namely, a direction shown by an arrow A in FIG. 4 and FIG. 7) away from the second base 112. FIG. 8 is a sectional view of the hinge mechanism in FIG. 4 in an N-N direction. As shown in FIG. 4 and FIG. 8, when the second gear connecting rod 1164 slides relative to the second housing mounting bracket 114, the linkage gear member 118 transfers sliding to the third gear connecting rod 1171, so that the third gear connecting rod 1171 is driven to slide relative to the second housing mounting bracket 114 in a direction (namely, a direction shown by an arrow B in FIG. 4 and FIG. 8) away from the first base 111. In this way, the third rotating gear 1172, the fourth rotating gear 1173, and the fourth gear connecting rod 1174 are driven to rotate synchronously, so that the fourth gear connecting rod 1174 slides relative to the third housing mounting bracket 115, to drive the third housing mounting bracket 115 to rotate in a direction (namely, a direction shown by an arrow D in FIG. 8) close to the second housing mounting bracket 114.

As shown in FIG. 4 and FIG. 8, when the user first folds the third housing mounting bracket 115, the third housing mounting bracket 115 rotates in a direction (namely, a direction shown by an arrow D in FIG. 8) close to the second housing mounting bracket 114. In this case, the fourth gear connecting rod 1174 slides relative to the third housing mounting bracket 115, to drive the fourth rotating gear 1173, the third rotating gear 1172, and the third gear connecting rod 1171 to rotate synchronously, so that the third gear connecting rod 1171 slides relative to the second housing mounting bracket 114 in a direction (namely, a direction shown by an arrow B in FIG. 4 and FIG. 8) away from the first base 111. As shown in FIG. 4 and FIG. 7, when the third gear connecting rod 1171 slides relative to the second housing mounting bracket 114, the linkage gear member 118 transfers sliding to the second gear connecting rod 1164, so that the second gear connecting rod 1164 is driven to slide relative to the second housing mounting bracket 114 in a direction (namely, a direction shown by an arrow A in FIG. 4 and FIG. 7) away from the second base 112. In this way, the second rotating gear 1163, the first rotating gear 1162, and the first gear connecting rod 1161 are driven to rotate synchronously, so that the first gear connecting rod 1161 slides relative to the first housing mounting bracket 113 toward the second housing mounting bracket 114 (that is, the direction shown by the arrow C in FIG. 7), to drive the first housing mounting bracket 113 to rotate in a direction close to the second housing mounting bracket 114.

Therefore, regardless of whether the first housing mounting bracket 113 or the third housing mounting bracket 115 is first folded by the user, the linkage gear member 118 can implement linkage of rotation of the first housing mounting bracket 113 and the third housing mounting bracket 115 relative to the second housing mounting bracket 114, to implement linkage folding of the electronic device 10.

As shown in FIG. 5, when the first rotating mechanism 116 is specifically disposed, the first gear connecting rod 1161 may include a first slider 11611 and a first gear segment 11612 that are fastened to each other. The first gear segment 11612 is disposed facing the first base 111 and engaged with the first rotating gear 1162, and the first slider 11611 is disposed facing the first housing mounting bracket 113. A side that is of the first housing mounting bracket 113 and that faces the first gear connecting rod 1161 has a first sliding groove 1131. The first slider 11611 is accommodated in the first sliding groove 1131 and slides in the first sliding groove 1131 to implement a sliding connection between the first gear connecting rod 1161 and the first housing mounting bracket 113. Similarly, the second gear connecting rod 1164 may include a second gear segment 11641 and a second slider 11642 that are fastened to each other. The second gear segment 11641 is disposed facing the first base 111 and engaged with the second rotating gear 1163, and the second slider 11642 is disposed facing the second housing mounting bracket 114. A side that is of the second housing mounting bracket 114 and that faces the second gear connecting rod 1164 has a second sliding groove 1141. The second slider

11642 is accommodated in the second sliding groove 1141 and slides in the second sliding groove 1141 to implement a sliding connection between the second gear connecting rod 1164 and the second housing mounting bracket 114. As shown in FIG. 6, when the second rotating mechanism 117 is specifically disposed, the third gear connecting rod 1171 may include a third slider 11711 and a third gear segment 11712 that are fastened to each other. The third gear segment 11712 is disposed facing the second base 112 and engaged with the third rotating gear 1172, and the third slider 11711 is disposed facing the second housing mounting bracket 114. A side that is of the second housing mounting bracket 114 and that faces the third gear connecting rod 1171 has a third sliding groove 1142. The third slider 11711 is accommodated in the third sliding groove 1142 and slides in the third sliding groove 1142 to implement a sliding connection between the third gear connecting rod 1171 and the second housing mounting bracket 114. Similarly, the fourth gear connecting rod 1174 includes a fourth gear segment 11741 and a fourth slider 11742 that are fastened to each other. The fourth gear segment 11741 is disposed facing the second base 112 and engaged with the fourth rotating gear 1173, and the fourth slider 11742 is disposed facing the third housing mounting bracket 115. A side that is of the third housing mounting bracket 115 and that faces the fourth gear connecting rod 1174 has a fourth sliding groove 1151. The fourth slider 11742 is accommodated in the fourth sliding groove 1151 and slides in the fourth sliding groove 1151 to implement a sliding connection between the fourth gear connecting rod 1174 and the third housing mounting bracket 115.

Figure 9:
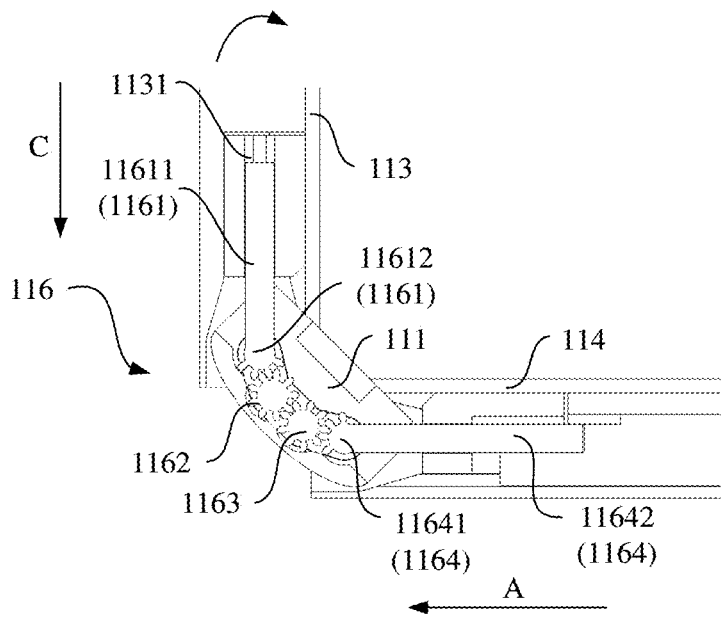
FIG. 9 is a diagram of a first rotating mechanism in FIG. 7.
Figure 10:
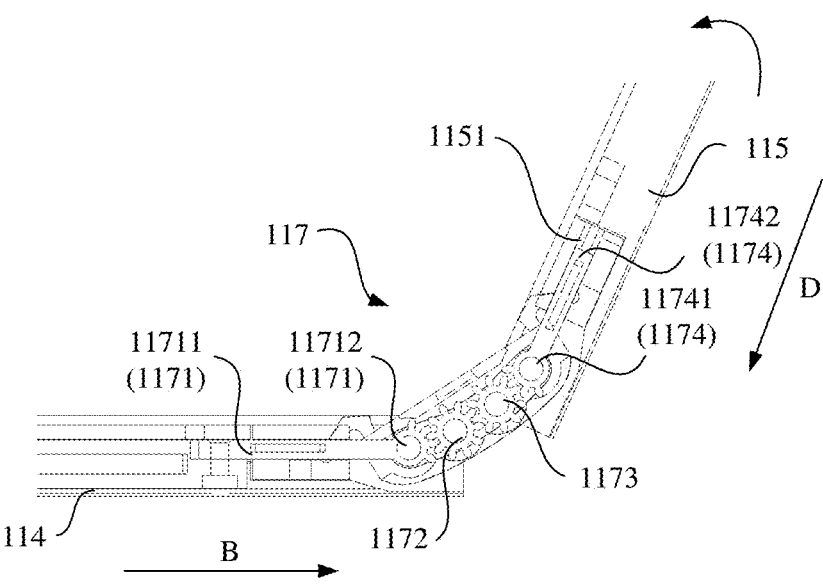
FIG. 10 is a diagram of a second rotating mechanism in FIG. 8.

FIG. 9 is a diagram of the first rotating mechanism in FIG. 7, and FIG. 10 is a diagram of the second rotating mechanism in FIG. 8. As shown in FIG. 9, when the first housing mounting bracket 113 rotates around the first base 111 toward the second housing mounting bracket 114 (as shown by a curved arrow in FIG. 9), the first housing mounting bracket 113 drives the first gear connecting rod 1161 to rotate around the first base 111, and the first slider 11611 slides in the first sliding groove 1131 in a direction shown by the arrow C. In a rotation process of the first gear connecting rod 1161, the first gear segment 11612 drives the first rotating gear 1162, the second rotating gear 1163, and the second gear segment 11641 to rotate synchronously, so that the second gear connecting rod 1164 rotates around the first base 111, and the second slider 11642 slides in the second sliding groove 1141 in a direction shown by the arrow A. As shown in FIG. 10, the linkage gear member 118 transfers sliding of the second slider 11642 to the third gear connecting rod 1171, so that the third slider 11711 slides in the third sliding groove 1142 in a direction shown by an arrow B in FIG. 10, to drive the third gear connecting rod 1171 to rotate around the second base 112. In a process in which the third gear connecting rod 1171 rotates around the second base 112, the third gear segment 11712 drives the third rotating gear 1172, the fourth rotating gear 1173, and the fourth gear segment 11741 to rotate synchronously, so that the fourth gear connecting rod 1174 rotates around the second base 112, and the fourth slider 11742 slides in the fourth sliding groove 1151 in a direction shown by the arrow D, to drive the third housing mounting bracket 115 to rotate around the second base 112 toward the second housing mounting bracket 114 (as shown by a curved arrow in FIG. 10).

Still refer to FIG. 10. When the third housing mounting bracket 115 rotates around the second base 112 toward the second housing mounting bracket 114 (as shown by the curved arrow in FIG. 10), the third housing mounting bracket 115 drives the fourth gear connecting rod 1174 to rotate around the second base 112, and the fourth slider 11742 slides in the fourth sliding groove 1151 in a direction shown by the arrow D. In a rotation process of the fourth gear connecting rod 1174, the fourth gear segment 11741 drives the fourth rotating gear 1173, the third rotating gear 1172, and the third gear segment 11712 to rotate synchronously, so that the third gear connecting rod 1171 rotates around the second base 112, and the third slider 11711 slides in the third sliding groove 1142 in the direction shown by the arrow B. As shown in FIG. 9, the linkage gear member 118 transfers sliding of the third slider 11711 to the second gear connecting rod 1164, so that the second slider 11642 slides in the second sliding groove 1141 in the direction shown by the arrow A, to drive the second gear connecting rod 1164 to rotate around the first base 111. In a process in which the second gear connecting rod 1164 rotates around the first base 111, the second gear segment 11641 drives the second rotating gear 1163, the first rotating gear 1162, and the first gear segment 11612 to rotate synchronously, so that the first gear connecting rod 1161 rotates around the first base 111, and the first slider 11611 slides in the first sliding groove 1131 in the direction shown by the arrow C, to drive the first housing mounting bracket 113 to rotate around the first base 111 toward the second housing mounting bracket 114 (as shown by the curved arrow in FIG. 9).

As shown in FIG. 4, in the electronic device 10, to implement linkage, a first rack 11643 is disposed on a side that is of the second gear connecting rod 1164 and that faces the linkage gear member 118, and the first rack 11643 is engaged with the linkage gear member 118. A second rack 11713 is disposed on a side that is of the third gear connecting rod 1171 and that faces the linkage gear member 118, and the second rack 11713 is engaged with the linkage gear member 118.

In some embodiments, the linkage gear member 118 may include at least one first linkage gear 1181. For example, as shown in FIG. 4, in a specific embodiment, the at least one first linkage gear 1181 may be two first linkage gears 1181, and the two first linkage gears 1181 are arranged in a sliding direction of the second gear connecting rod 1164 and the third gear connecting rod 1171. The first linkage gear 1181 has a first tooth. In this embodiment, because both the second gear connecting rod 1164 and the third gear connecting rod 1171 are in transmission connection with the first linkage gear 1181, sliding distances of the second gear connecting rod 1164 and the third gear connecting rod 1171 on the second housing mounting bracket 114 are equal.

Figure 11:
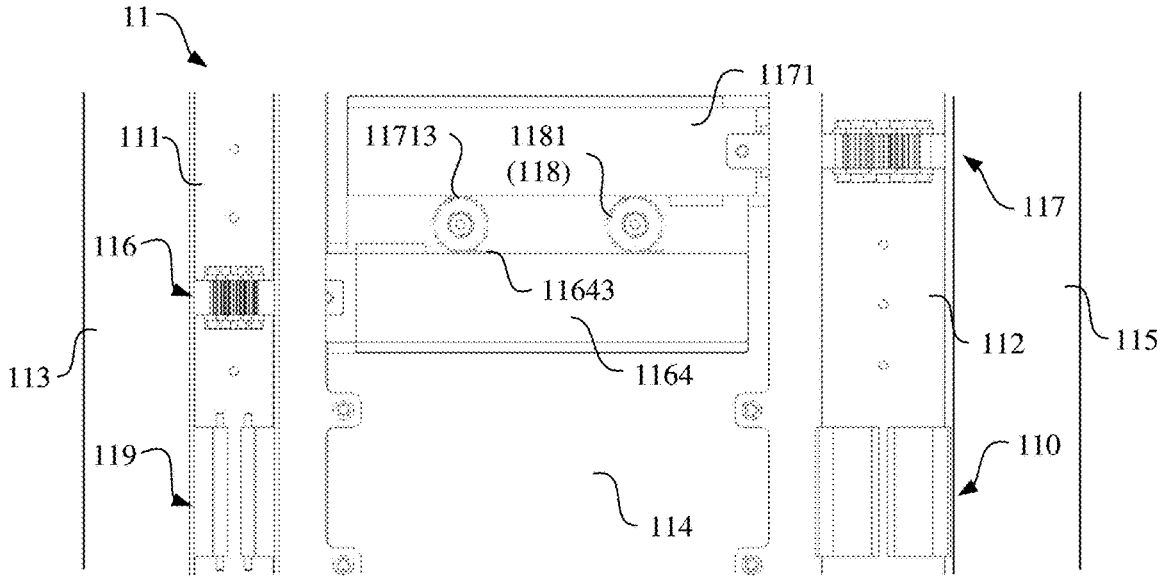
FIG. 11 is another diagram of a hinge mechanism according to an embodiment of this application.
Figure 12:
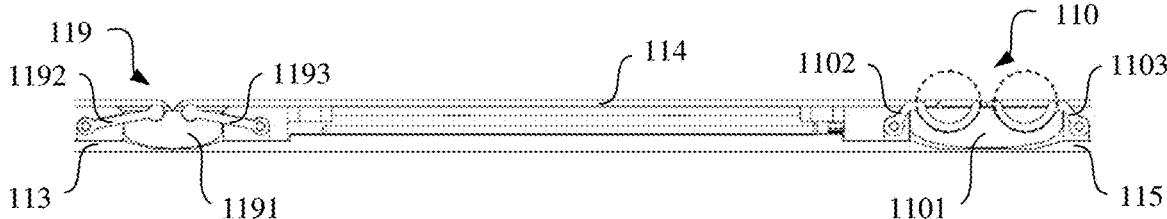
FIG. 12 is a diagram of a first differential mechanism and a second differential mechanism according to an embodiment of this application.

In the electronic device 10, to fold the first housing mounting bracket 113 and the third housing mounting bracket 115 in a specified sequence, the hinge mechanism 11 may further include a first differential mechanism 119 and a second differential mechanism 110. FIG. 11 is another diagram of the hinge mechanism according to this embodiment of this application. FIG. 12 is a diagram of the first differential mechanism and the second differential mechanism according to this embodiment of this application. As shown in FIG. 11 and FIG. 12, the first differential mechanism 119 may include a first hinge 1191, a first rotating member 1192, and a second rotating member 1193. The first hinge 1191 is disposed on the first base 111. The first rotating member 1192 is rotatably connected between the first housing mounting bracket 113 and the first hinge 1191. The second rotating member 1193 is rotatably connected between the second housing mounting bracket 114 and the first hinge 1191. Similarly, the second differential mechanism 110 may include a second hinge 1101, a third rotating member 1102, and a fourth rotating member 1103. The second hinge 1101 is disposed on the second base 112. The third rotating member 1102 is rotatably connected between the second housing mounting bracket 114 and the second hinge 1101. The fourth rotating member 1103 is rotatably connected between the third housing mounting bracket 115 and the second hinge 1101. A rotation radius of the first differential mechanism 119 is different from a rotation radius of the second differential mechanism 110, that is, the rotation radius of the first differential mechanism 119 is greater than the rotation radius of the second differential mechanism 110, or the rotation radius of the first differential mechanism 119 is less than the rotation radius of the second differential mechanism 110.

In some embodiments, when the rotation radius of the first differential mechanism 119 is less than the rotation radius of the second differential mechanism 110, because the sliding distances of the second gear connecting rod 1164 and the third gear connecting rod 1171 on the second housing mounting bracket 114 are equal, an angular velocity at which the second differential mechanism 110 rotates around the second housing mounting bracket 114 is less than an angular velocity at which the first differential mechanism 119 rotates around the second housing mounting bracket 114, so that a rotation speed of the second differential mechanism 110 is less than a rotation speed of the first differential mechanism 119, and therefore a rotation speed of the third housing mounting bracket 115 is less than a rotation speed of the first housing mounting bracket 113. Therefore, when the first housing mounting bracket 113 or the third housing mounting bracket 115 is pushed by an external force to rotate, the first linkage gear 1181 can implement linkage folding of the first housing mounting bracket 113 and the third housing mounting bracket 115, and the first differential mechanism 119 and the second differential mechanism 110 can implement differential rotation of the first housing mounting bracket 113 and the third housing mounting bracket 115. In this way, the first housing mounting bracket 113 is first folded to one side of the second housing mounting bracket 114, and then the third housing mounting bracket 115 is folded to a side that is of the first housing mounting bracket 113 and that is away from the second housing mounting bracket 114.

In some other embodiments, when the rotation radius of the first differential mechanism 119 is greater than the rotation radius of the second differential mechanism 110, because the sliding distances of the second gear connecting rod 1164 and the third gear connecting rod 1171 on the second housing mounting bracket 114 are equal, an angular velocity at which the second differential mechanism 110 rotates around the second housing mounting bracket 114 is greater than an angular velocity at which the first differential mechanism 119 rotates around the second housing mounting bracket 114, so that a rotation speed of the second differential mechanism 110 is greater than a rotation speed of the first differential mechanism 119, and therefore a rotation speed of the third housing mounting bracket 115 is greater than a rotation speed of the first housing mounting bracket 113. Therefore, when the first housing mounting bracket 113 or the third housing mounting bracket 115 is pushed by an external force to rotate, the first linkage gear 1181 can implement linkage folding of the first housing mounting bracket 113 and the third housing mounting bracket 115, and the first differential mechanism 119 and the second differential mechanism 110 can implement differential rotation of the first housing mounting bracket 113 and the third housing mounting bracket 115. In this way, the third housing mounting bracket 115 is first folded to one side of the second housing mounting bracket 114, and then the first housing mounting bracket 113 is folded to a side that is of the third housing mounting bracket 115 and that is away from the second housing mounting bracket 114.

Figure 13:
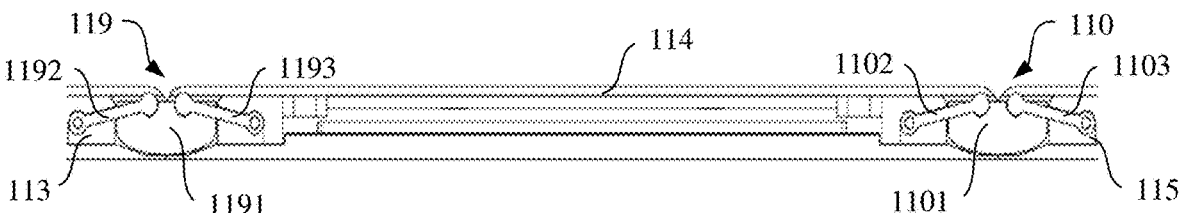
FIG. 13 is another diagram of a first differential mechanism and a second differential mechanism according to an embodiment of this application.

FIG. 13 is another diagram of the first differential mechanism and the second differential mechanism according to this embodiment of this application. As shown in FIG. 13, in some embodiments, the first rotating member 1192 may be a first connecting rod, and the second rotating member 1193 may be a second connecting rod. In this embodiment, the first hinge 1191 is fastened to the first base 111. One end of the first connecting rod may be sleeved on the first hinge 1191, and the other end may be rotatably connected to the first housing mounting bracket 113 by using a pin shaft. One end of the second connecting rod may be sleeved on the first hinge 1191, and the other end may be rotatably connected to the second housing mounting bracket 114 by using a pin shaft. In some other embodiments, the first hinge 1191 may alternatively be provided with a first accommodation groove and a second accommodation groove, the first housing mounting bracket 113 is provided with a third accommodation groove, and the second housing mounting bracket 114 is provided with a fourth accommodation groove. One end of the first connecting rod is accommodated in the first accommodation groove, and rotates in the first accommodation groove, to implement a rotational connection between the first connecting rod and the first hinge 1191; and the other end is accommodated in the third accommodation groove, and rotates in the third accommodation groove, to implement a rotational connection between the first connecting rod and the first housing mounting bracket 113. One end of the second connecting rod is accommodated in the second accommodation groove, and rotates in the second accommodation groove, to implement a rotational connection between the second connecting rod and the first hinge 1191; and the other end is accommodated in the fourth accommodation groove, and rotates in the fourth accommodation groove, to implement a rotational connection between the second connecting rod and the second housing mounting bracket 114. Similarly, the third rotating member 1102 may be a third connecting rod, and the fourth rotating member 1103 may be a fourth connecting rod. In this embodiment, the second hinge 1101 is fastened to the second base 112. One end of the third connecting rod may be sleeved on the second hinge 1101, and the other end may be rotatably connected to the second housing mounting bracket 114 by using a pin shaft. One end of the third connecting rod may be sleeved on the second hinge 1101, and the other end may be rotatably connected to the third housing mounting bracket 115 by using a pin shaft. In some other embodiments, the second hinge 1101 may alternatively be provided with a fifth accommodation groove and a sixth accommodation groove, the second housing mounting bracket 114 is provided with a seventh accommodation groove, and the third housing mounting bracket 115 is provided with an eighth accommodation groove. One end of the third connecting rod is accommodated in the fifth accommodation groove, and rotates in the fifth accommodation groove, to implement a rotational connection between the third connecting rod and the second hinge 1101; and the other end is accommodated in the seventh accommodation groove, and rotates in the seventh accommodation groove, to implement a rotational connection between the third connecting rod and the second housing mounting bracket 114. One end of the fourth connecting rod is accommodated in the sixth accommodation groove, and rotates in the sixth accommodation groove, to implement a rotational connection between the fourth connecting rod and the second hinge 1101; and the other end is accommodated in the eighth accommodation groove, and rotates in the eighth accommodation groove, to implement a rotational connection between the fourth connecting rod and the third housing mounting bracket 115.

Figure 14:
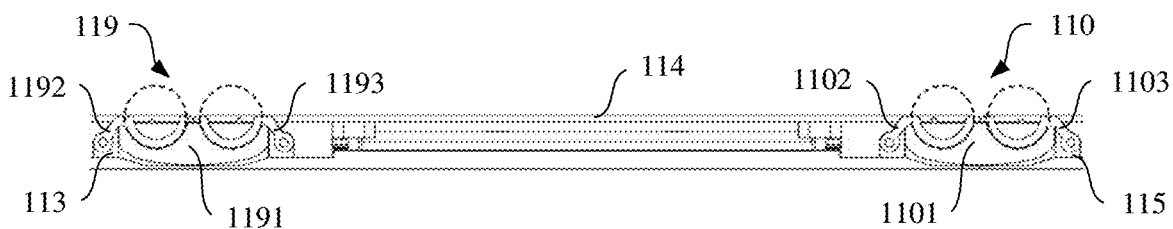
FIG. 14 is another diagram of a first differential mechanism and a second differential mechanism according to an embodiment of this application.

FIG. 14 is another diagram of the first differential mechanism and the second differential mechanism according to this embodiment of this application. As shown in FIG. 14, in some other embodiments, the first rotating member 1192 may alternatively be a first arc arm. A first arc-shaped guiding groove is provided on a side that is of the first hinge 1191 and that is close to the first arc arm. The first arc arm is accommodated in the first arc-shaped guiding groove, and slides in the first arc-shaped guiding groove, to implement a rotational connection between the first rotating member 1192 and the first hinge 1191. The second rotating member 1193 may be a second arc arm. A second arc-shaped guiding groove is provided on a side that is of the first hinge 1191 and that is close to the second arc arm. The second arc arm is accommodated in the second arc-shaped guiding groove, and slides in the second arc-shaped guiding groove, to implement a rotational connection between the second rotating member 1193 and the first hinge 1191. Similarly, the third rotating member 1102 may alternatively be a third arc arm. A third arc-shaped guiding groove is provided on a side that is of the second hinge 1101 and that is close to the third arc arm. The third arc arm is accommodated in the third arc-shaped guiding groove, and slides in the third arc-shaped guiding groove, to implement a rotational connection between the third rotating member 1102 and the second hinge 1101. The fourth rotating member 1103 may alternatively be a fourth arc arm. A fourth arc-shaped guiding groove is provided on a side that is of the second hinge 1101 and that is close to the fourth arc arm. The fourth arc arm is accommodated in the fourth arc-shaped guiding groove, and slides in the fourth arc-shaped guiding groove, to implement a rotational connection between the fourth rotating member 1103 and the second hinge 1101.

Figure 15:
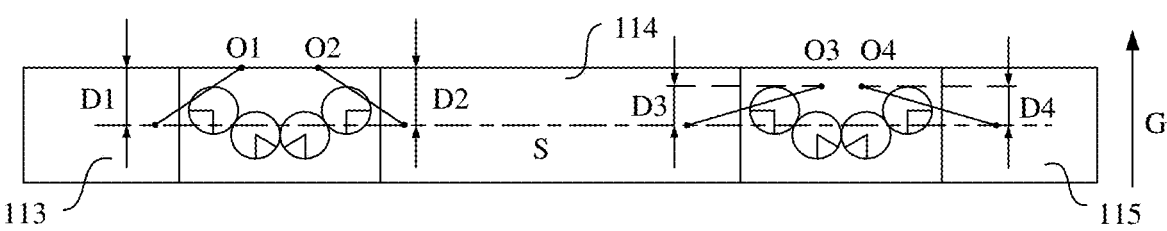
FIG. 15 is another diagram of a first differential mechanism and a second differential mechanism according to an embodiment of this application.

In this application, a differential speed is implemented by setting the rotation radius of the first differential mechanism 119 and the rotation radius of the second differential mechanism 110 to different rotation radii. FIG. 15 is another diagram of the first differential mechanism and the second differential mechanism according to this embodiment of this application. As shown in FIG. 15, specifically, the second housing mounting bracket 114 has a middle plane S. When the hinge mechanism 11 is in an unfolded state, there is a first distance D1 between a rotation axis center O1 of the first rotating member 1192 and the middle plane S in a thickness direction of the second housing mounting bracket 114 (that is, shown by an arrow G in FIG. 15), and there is a second distance D2 between a rotation axis center O2 of the second rotating member 1193 and the middle plane S. The first distance D1 is equal to the second distance D2. Correspondingly, there is a third distance D3 between a rotation axis center O3 of the third rotating member 1102 and the middle plane S, and there is a fourth distance D4 between a rotation axis center O4 of the fourth rotating member 1103 and the middle plane S. The third distance D3 is equal to the fourth distance D4, and the first distance D1 is not equal to the third distance D3. A rotation radius of the first hinge 1191 around the second housing mounting bracket 114 is different from a rotation radius of the second hinge 1101 around the second housing mounting bracket 114. In this way, the rotation radius of the first differential mechanism 119 may be different from the rotation radius of the second differential mechanism 110.

Figure 16:
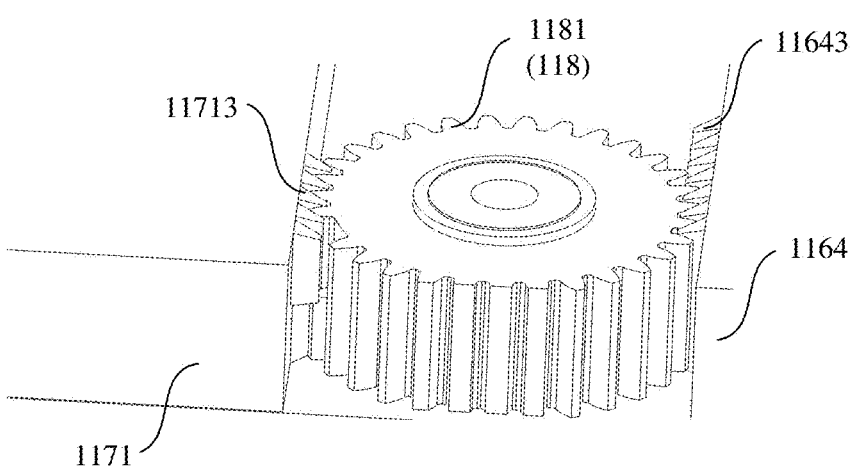
FIG. 16 is another diagram of a hinge mechanism according to an embodiment of this application.
Figure 17:
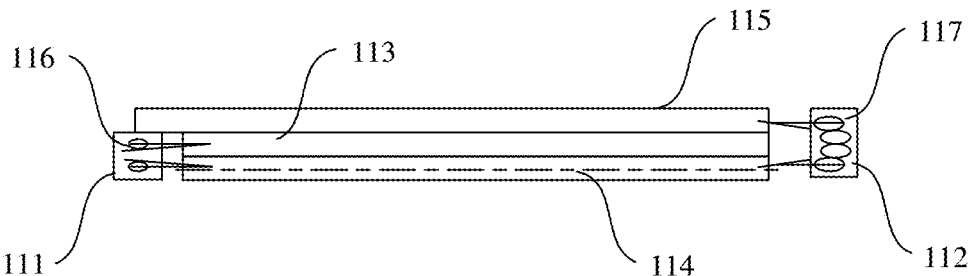
FIG. 17 is a diagram of an electronic device in a folded state according to an embodiment of this application.

In actual use, when the electronic device 10 is folded from an initial unfolded state, after the first base 111 rotates by 90°, the first housing mounting bracket 113 and the second housing mounting bracket 114 can be closed. In this case, the second base 112 rotates to an angle, as shown in FIG. 3. FIG. 16 is another diagram of the hinge mechanism according to this embodiment of this application. As shown in FIG. 16, in this case, the first rack 11643 is detached from the linkage gear member 118, so that the second base 112 and the third housing fastener may continue to rotate, and the second rack 11713 continues to slide with the third gear connecting rod 1171. FIG. 17 is a diagram of the electronic device in the folded state according to this embodiment of this application. As shown in FIG. 17, after the second base 112 rotates by 90°, the third housing mounting bracket 115 is stacked on the side that is of the first housing mounting bracket 113 and that is away from the second housing mounting bracket 114, to close the third housing mounting bracket 115, the first housing mounting bracket 113, and the second housing mounting bracket 114.

Figure 18:
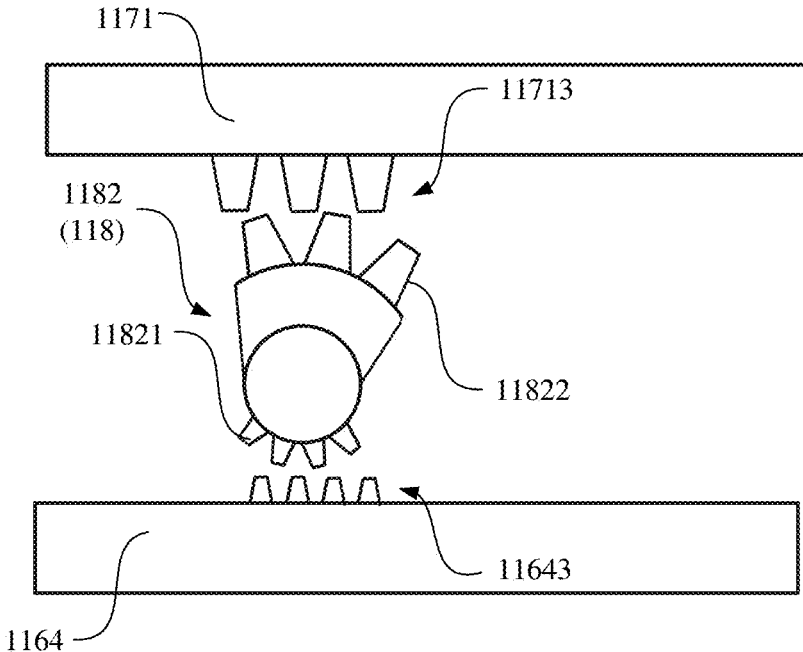
FIG. 18 is a diagram of a linkage gear member according to an embodiment of this application.

FIG. 18 is a diagram of the linkage gear member according to this embodiment of this application. As shown in FIG. 18, in some other embodiments, the linkage gear member 118 includes at least one second linkage gear 1182. A second tooth 11821 is disposed on a side that is of the second linkage gear 1182 and that faces the second gear connecting rod 1164, and a third tooth 11822 is disposed on a side that is of the second linkage gear 1182 and that faces the third gear connecting rod 1171. The second tooth 11821 is different from the third tooth 11822. Specifically, the second tooth 11821 may be different from the third tooth 11822 in at least one of a quantity of teeth, a modulus, a tooth pitch, and a reference diameter. In this embodiment, the second linkage gear 1182 is a special-shaped gear, and linkage and differential functions of the second gear connecting rod 1164 and the third gear connecting rod 1171 can be implemented by using the second linkage gear 1182, so that a structure of the hinge mechanism 11 can be simplified.

The terms used in the foregoing embodiments are merely for the purpose of describing specific embodiments, but are not intended to limit this application. The terms "one", "a", "the", "the foregoing", "this", and "the one" of singular forms used in this specification and the appended claims of this application are also intended to include expressions such as "one or more", unless otherwise specified in the context clearly.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A hinge mechanism, used in a foldable electronic device, wherein the hinge mechanism comprises:

a first base and a second base that are disposed in parallel;

a first housing mounting bracket, a second housing mounting bracket, and a third housing mounting bracket, wherein the second housing mounting bracket is rotatably connected between the first base and the second base, the first housing mounting bracket is rotatably connected to a side that is of the first base and that is other than a side of the first base that is closest to the second housing mounting bracket, and the third housing mounting bracket is rotatably connected to a side that is of the second base and that is other than a side of the second base that is closest to the second housing mounting bracket;

a first rotating mechanism, comprising a first rotating gear, a second rotating gear, a first gear connecting rod, and a second gear connecting rod, wherein the first rotating gear and the second rotating gear are engaged and separately rotatably connected to the first base, and the second rotating gear is located on a side that is of the first rotating gear and that is other than a side of the first rotating gear that is closest to the first housing mounting bracket; a first end of the first gear connecting rod is engaged with the first rotating gear, and a second end of the first gear connecting rod is slidably connected to the first housing mounting bracket; and a first end of the second gear connecting rod is engaged with the second rotating gear, and a second end of the second gear connecting rod is slidably connected to the second housing mounting bracket;

a second rotating mechanism, comprising a third rotating gear, a fourth rotating gear, a third gear connecting rod, and a fourth gear connecting rod, wherein the third rotating gear and the fourth rotating gear are engaged and separately rotatably connected to the second base, and the fourth rotating gear is located on a side that is of the third rotating gear and that is other than a side of the third rotating gear that is closest to the second housing mounting bracket; a first end of the third gear connecting rod is engaged with the third rotating gear, and a second end of the third gear connecting rod is slidably connected to the second housing mounting bracket; a first end of the fourth gear connecting rod is engaged with the fourth rotating gear, and a second end of the fourth gear connecting rod is slidably connected to the third housing mounting bracket; and a sliding track of the second gear connecting rod relative to the second housing mounting bracket is parallel to and does not coincide with a sliding track of the third gear connecting rod relative to the second housing mounting bracket; and a linkage gear member disposed on the second housing mounting bracket, wherein the linkage gear member is located between the second gear connecting rod and the third gear connecting rod, and is separately engaged with the second gear connecting rod and the third gear connecting rod for transmission, and wherein:

when the first housing mounting bracket rotates in a direction towards the second housing mounting bracket, the first rotating gear, the second rotating gear, the first gear connecting rod, and the second gear connecting rod rotate synchronously, the second gear connecting rod slides relative to the second housing mounting bracket in a direction away from the second base, and the linkage gear member drives the third gear connecting rod to slide in a direction away from the first base, in a manner that drives the third gear connecting rod, the third rotating gear, the fourth rotating gear, and the fourth gear connecting rod to rotate synchronously, to cause the third housing mounting bracket to rotate in a direction towards the second housing mounting bracket; or when the third housing mounting bracket rotates in a direction towards the second housing mounting bracket, the third rotating gear, the fourth rotating gear, the third gear connecting rod, and the fourth gear connecting rod rotate synchronously, the third gear connecting rod slides relative to the second housing mounting bracket in a direction away from the first base, and the linkage gear member drives the second gear connecting rod to slide in a direction away from the second base, driving the second gear connecting rod, the second rotating gear, the first rotating gear, and the first gear connecting rod to rotate synchronously, causing the first housing mounting bracket to rotate in a direction close to the second housing mounting bracket.

2. The hinge mechanism according to claim 1, wherein the linkage gear member comprises at least one first linkage gear, and the at least one first linkage gear comprises a first tooth.

3. The hinge mechanism according to claim 1, wherein the linkage gear member comprises at least one second linkage gear, a second tooth is disposed on a side that is of the at least one second linkage gear and that faces the second gear connecting rod, a third tooth is disposed on a side that is of the at least one second linkage gear and that faces the third gear connecting rod, and the second tooth is different from the third tooth.

4. The hinge mechanism according to claim 3, wherein the second tooth is different from the third tooth in at least one of a quantity of teeth, a modulus, a tooth pitch, or a reference diameter.

5. The hinge mechanism according to claim 1, further comprising:
  a first differential mechanism and a second differential mechanism;
  wherein the first differential mechanism comprises a first hinge, a first rotating member, and a second rotating member, wherein the first hinge is disposed on the first base, the first rotating member is rotatably connected between the first housing mounting bracket and the first hinge, and the second rotating member is rotatably connected between the second housing mounting bracket and the first hinge; and
  wherein the second differential mechanism comprises a second hinge, a third rotating member, and a fourth rotating member, wherein the second hinge is disposed on the second base, the third rotating member is rotatably connected between the second housing mounting bracket and the second hinge, and the fourth rotating member is rotatably connected between the third housing mounting bracket and the second hinge; and
  wherein a rotation radius of the first differential mechanism is different from a rotation radius of the second differential mechanism.

6. The hinge mechanism according to claim 5, wherein the first rotating member is a first connecting rod, and the second rotating member is a second connecting rod; or
  wherein the first rotating member is a first arc arm, and a first arc-shaped guiding groove extends in a side that is of the first hinge and that is closest to the first arc arm; the first arc arm is accommodated in the first arc-shaped guiding groove, and slides in the first arc-shaped guiding groove, to implement a rotational connection between the first rotating member and the first hinge; the second rotating member is a second arc arm, and a second arc-shaped guiding groove extends in a side that is of the first hinge and that is closest to the second arc arm; and the second arc arm is accommodated in the second arc-shaped guiding groove, and slides in the second arc-shaped guiding groove, to implement a rotational connection between the second rotating member and the first hinge.

7. The hinge mechanism according to claim 5, wherein the third rotating member is a third connecting rod, and the fourth rotating member is a fourth connecting rod; or
  wherein the third rotating member is a third arc arm, and a third arc-shaped guiding groove extends in a side that is of the second hinge and that is closest to the third arc arm; the third arc arm is accommodated in the third arc-shaped guiding groove, and slides in the third arc-shaped guiding groove, to implement a rotational connection between the third rotating member and the second hinge; the fourth rotating member is a fourth arc arm, and a fourth arc-shaped guiding groove extends in a side that is of the second hinge and that is closest to the fourth arc arm; and the fourth arc arm is accommodated in the fourth arc-shaped guiding groove, and slides in the fourth arc-shaped guiding groove, to implement a rotational connection between the fourth rotating member and the second hinge.

8. The hinge mechanism according to claim 5, wherein the second housing mounting bracket comprises a middle plane;
  wherein when the hinge mechanism is in an unfolded state, there is a first distance between a rotation axis center of the first rotating member and the middle plane in a thickness direction of the second housing mounting bracket, there is a second distance between a rotation axis center of the second rotating member and the middle plane, there is a third distance between a rotation axis center of the third rotating member and the middle plane, and there is a fourth distance between a rotation axis center of the fourth rotating member and the middle plane, wherein the first distance is equal to the second distance, the third distance is equal to the fourth distance, and the first distance is not equal to the third distance; and
  wherein a rotation radius of the first hinge around the second housing mounting bracket is different from a rotation radius of the second hinge around the second housing mounting bracket.

9. The hinge mechanism according to claim 1, wherein the first gear connecting rod comprises a first gear segment and a first slider that are fastened to each other, the first gear segment is engaged with the first rotating gear, a first sliding groove extends in a side that is of the first housing mounting bracket and that faces the first gear connecting rod, and the first slider is accommodated in the first sliding groove and slides in the first sliding groove to implement a sliding connection between the first gear connecting rod and the first housing mounting bracket; and the second gear connecting rod comprises a second gear segment and a second slider that are fastened to each other, the second gear segment is engaged with the second rotating gear, a second sliding groove extends in a side that is of the second housing mounting bracket and that faces the second gear connecting rod, and the second slider is accommodated in the second sliding groove and slides in the second sliding groove to implement a sliding connection between the second gear connecting rod and the second housing mounting bracket; and
  wherein the third gear connecting rod comprises a third gear segment and a third slider that are fastened to each other, the third gear segment is engaged with the third rotating gear, a third sliding groove extends in a side that is of the second housing mounting bracket and that faces the third gear connecting rod, and the third slider is accommodated in the third sliding groove and slides in the third sliding groove to implement a sliding connection between the third gear connecting rod and the second housing mounting bracket; and the fourth gear connecting rod comprises a fourth gear segment and a fourth slider that are fastened to each other, the fourth gear segment is engaged with the fourth rotating gear, a fourth sliding groove extends in a side that is of the third housing mounting bracket and that faces the fourth gear connecting rod, and the fourth slider is accommodated in the fourth sliding groove and slides in the fourth sliding groove to implement a sliding connection between the fourth gear connecting rod and the third housing mounting bracket.

10. The hinge mechanism according to claim 1, wherein a first rack is disposed on a side that is of the second gear connecting rod and that faces the linkage gear member, and the first rack is engaged with the linkage gear member; and
　wherein a second rack is disposed on a side that is of the third gear connecting rod and that faces the linkage gear member, and the second rack is engaged with the linkage gear member.

11. An electronic device, comprising:
　a flexible display, a first housing, a second housing, a third housing, and a hinge mechanism, wherein the first housing is fastened to a first housing mounting bracket, the second housing is fastened to a second housing mounting bracket, the third housing is fastened to a third housing mounting bracket, and the flexible display continuously covers the first housing, the second housing, the third housing, and the hinge mechanism, and is separately fastened to the first housing, the second housing, and the third housing;
　wherein the hinge mechanism comprises:
　　a first base and a second base that are disposed in parallel;
　　a first housing mounting bracket, a second housing mounting bracket, and a third housing mounting bracket, wherein the second housing mounting bracket is rotatably connected between the first base and the second base, the first housing mounting bracket is rotatably connected to a side that is of the first base and that is other than a side of the first base that is closest to the second housing mounting bracket, and the third housing mounting bracket is rotatably connected to a side that is of the second base and that is other than a side of the second base that is closest to the second housing mounting bracket;
　　a first rotating mechanism, comprising a first rotating gear, a second rotating gear, a first gear connecting rod, and a second gear connecting rod, wherein the first rotating gear and the second rotating gear are engaged and separately rotatably connected to the first base, and the second rotating gear is located on a side that is of the first rotating gear and that is away from the first housing mounting bracket; one end of the first gear connecting rod is engaged with the first rotating gear, and the other end is slidably connected to the first housing mounting bracket; and one end of the second gear connecting rod is engaged with the second rotating gear, and the other end is slidably connected to the second housing mounting bracket;
　　a second rotating mechanism, comprising a third rotating gear, a fourth rotating gear, a third gear connecting rod, and a fourth gear connecting rod, wherein the third rotating gear and the fourth rotating gear are engaged and separately rotatably connected to the second base, and the fourth rotating gear is located on a side that is of the third rotating gear and that is other than a side of the third rotating gear that is closest to the second housing mounting bracket; a first end of the third gear connecting rod is engaged with the third rotating gear, and a second end of the third gear connecting rod is slidably connected to the second housing mounting bracket; a first end of the fourth gear connecting rod is engaged with the fourth rotating gear, and a second end of the fourth gear connecting rod is slidably connected to the third housing mounting bracket; and a sliding track of the second gear connecting rod relative to the second housing mounting bracket is parallel to and does not coincide with a sliding track of the third gear connecting rod relative to the second housing mounting bracket; and
　wherein a linkage gear member is disposed on the second housing mounting bracket, wherein the linkage gear member is located between the second gear connecting rod and the third gear connecting rod, and is separately engaged with the second gear connecting rod and the third gear connecting rod for transmission, and wherein:
　　when the first housing mounting bracket rotates in a direction towards the second housing mounting bracket, the first rotating gear, the second rotating gear, the first gear connecting rod, and the second gear connecting rod rotate synchronously, the second gear connecting rod slides relative to the second housing mounting bracket in a direction away from the second base, and the linkage gear member drives the third gear connecting rod to slide in a direction away from the first base, in a manner that drives the third gear connecting rod, the third rotating gear, the fourth rotating gear, and the fourth gear connecting rod to rotate synchronously, causing the third housing mounting bracket to rotate in a direction close to the second housing mounting bracket; or
　　when the third housing mounting bracket rotates in a direction close to the second housing mounting bracket, the third rotating gear, the fourth rotating gear, the third gear connecting rod, and the fourth gear connecting rod rotate synchronously, the third gear connecting rod slides relative to the second housing mounting bracket in a direction away from the first base, and the linkage gear member drives the second gear connecting rod to slide in a direction away from the second base, driving the second gear connecting rod, the second rotating gear, the first rotating gear, and the first gear connecting rod to rotate synchronously, and causing the first housing mounting bracket to rotate in a direction close to the second housing mounting bracket.

12. The electronic device according to claim 11, wherein:
　a rotation axis center of the first rotating mechanism rotating around the first base is located on a side that is of the first base and that faces the flexible display, and a rotation axis center of the second rotating mechanism rotating around the second base is located on a side that is of the second base and that faces the flexible display;
　a rotation axis center of the first rotating mechanism rotating around the first base is located on a side that is of the first base and that is away from the flexible display, and a rotation axis center of the second rotating mechanism rotating around the second base is located on a side that is of the second base and that is away from the flexible display; or
　a rotation axis center of the first rotating mechanism rotating around the first base is located on a side that is of the first base and that faces the flexible display, and a rotation axis center of the second rotating mechanism rotating around the second base is located on a side that is of the second base and that is away from the flexible display.

13. The electronic device according to claim 11, wherein the linkage gear member comprises at least one first linkage gear, and the at least one first linkage gear comprises a first tooth.

14. The electronic device according to claim 11, wherein the linkage gear member comprises at least one second linkage gear, a second tooth is disposed on a side that is of the at least one second linkage gear and that faces the second gear connecting rod, a third tooth is disposed on a side that is of the at least one second linkage gear and that faces the third gear connecting rod, and the second tooth is different from the third tooth.

15. The electronic device according to claim 14, wherein the second tooth is different from the third tooth in at least one of a quantity of teeth, a modulus, a tooth pitch, or a reference diameter.

16. The electronic device according to claim 11, further comprising a first differential mechanism and a second differential mechanism;

wherein the first differential mechanism comprises a first hinge, a first rotating member, and a second rotating member, wherein the first hinge is disposed on the first base, the first rotating member is rotatably connected between the first housing mounting bracket and the first hinge, and the second rotating member is rotatably connected between the second housing mounting bracket and the first hinge;

wherein the second differential mechanism comprises a second hinge, a third rotating member, and a fourth rotating member, wherein the second hinge is disposed on the second base, the third rotating member is rotatably connected between the second housing mounting bracket and the second hinge, and the fourth rotating member is rotatably connected between the third housing mounting bracket and the second hinge; and wherein a rotation radius of the first differential mechanism is different from a rotation radius of the second differential mechanism.

17. The electronic device according to claim 16, wherein the first rotating member is a first connecting rod, and the second rotating member is a second connecting rod; or wherein the first rotating member is a first arc arm, and a first arc-shaped guiding groove extends in a side that is of the first hinge and that is closest to the first arc arm; the first arc arm is accommodated in the first arc-shaped guiding groove, and slides in the first arc-shaped guiding groove, to implement a rotational connection between the first rotating member and the first hinge; the second rotating member is a second arc arm, and a second arc-shaped guiding groove extends in a side that is of the first hinge and that is closest to the second arc arm; and the second arc arm is accommodated in the second arc-shaped guiding groove, and slides in the second arc-shaped guiding groove, to implement a rotational connection between the second rotating member and the first hinge.

18. The electronic device according to claim 16, wherein the third rotating member is a third connecting rod, and the fourth rotating member is a fourth connecting rod; or wherein the third rotating member is a third arc arm, and a third arc-shaped guiding groove extends in a side that is of the second hinge and that is closest to the third arc arm; the third arc arm is accommodated in the third arc-shaped guiding groove, and slides in the third arc-shaped guiding groove, to implement a rotational connection between the third rotating member and the second hinge; the fourth rotating member is a fourth arc arm, and a fourth arc-shaped guiding groove extends in a side that is of the second hinge and that is closest to the fourth arc arm; and the fourth arc arm is accommodated in the fourth arc-shaped guiding groove, and slides in the fourth arc-shaped guiding groove, to implement a rotational connection between the fourth rotating member and the second hinge.

19. The electronic device according to claim 16, wherein the second housing mounting bracket comprises a middle plane; when the hinge mechanism is in an unfolded state, there is a first distance between a rotation axis center of the first rotating member and the middle plane in a thickness direction of the second housing mounting bracket, there is a second distance between a rotation axis center of the second rotating member and the middle plane, there is a third distance between a rotation axis center of the third rotating member and the middle plane, and there is a fourth distance between a rotation axis center of the fourth rotating member and the middle plane, wherein the first distance is equal to the second distance, the third distance is equal to the fourth distance, and the first distance is not equal to the third distance; and a rotation radius of the first hinge around the second housing mounting bracket is different from a rotation radius of the second hinge around the second housing mounting bracket.

20. The electronic device according to claim 11, wherein the first gear connecting rod comprises a first gear segment and a first slider that are fastened to each other, the first gear segment is engaged with the first rotating gear, a first sliding groove extends in a side that is of the first housing mounting bracket and that faces the first gear connecting rod, and the first slider is accommodated in the first sliding groove and slides in the first sliding groove to implement a sliding connection between the first gear connecting rod and the first housing mounting bracket; and the second gear connecting rod comprises a second gear segment and a second slider that are fastened to each other, the second gear segment is engaged with the second rotating gear, a second sliding groove extends in a side that is of the second housing mounting bracket and that faces the second gear connecting rod, and the second slider is accommodated in the second sliding groove and slides in the second sliding groove to implement a sliding connection between the second gear connecting rod and the second housing mounting bracket; and wherein the third gear connecting rod comprises a third gear segment and a third slider that are fastened to each other, the third gear segment is engaged with the third rotating gear, a third sliding groove extends in a side that is of the second housing mounting bracket and that faces the third gear connecting rod, and the third slider is accommodated in the third sliding groove and slides in the third sliding groove to implement a sliding connection between the third gear connecting rod and the second housing mounting bracket; and the fourth gear connecting rod comprises a fourth gear segment and a fourth slider that are fastened to each other, the fourth gear segment is engaged with the fourth rotating gear, a fourth sliding groove extends in a side that is of the third housing mounting bracket and that faces the fourth gear connecting rod, and the fourth slider is accommodated in the fourth sliding groove and slides in the fourth sliding groove to implement a sliding connection between the fourth gear connecting rod and the third housing mounting bracket.

* * * * *